United States Patent
Daimon et al.

(10) Patent No.: US 10,840,878 B2
(45) Date of Patent: Nov. 17, 2020

(54) ELASTIC WAVE DEVICE

(71) Applicant: Murata Manufacturing Co., Ltd., Nagaokakyo (JP)

(72) Inventors: Katsuya Daimon, Nagaokakyo (JP); Masato Araki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 602 days.

(21) Appl. No.: 15/787,778

(22) Filed: Oct. 19, 2017

(65) Prior Publication Data
US 2018/0062612 A1 Mar. 1, 2018

Related U.S. Application Data

(63) Continuation of application No. PCT/JP2016/061245, filed on Apr. 6, 2016.

(30) Foreign Application Priority Data

Apr. 24, 2015 (JP) ................................ 2015-089209

(51) Int. Cl.
*H03H 9/02* (2006.01)
*H03H 9/145* (2006.01)
(Continued)

(52) U.S. Cl.
CPC .... *H03H 9/02992* (2013.01); *H03H 9/14532* (2013.01); *H03H 9/25* (2013.01); *H03H 9/56* (2013.01); *H03H 9/6496* (2013.01)

(58) Field of Classification Search
CPC .. H03H 9/02992; H03H 9/14532; H03H 9/25; H03H 9/56; H03H 9/6496
See application file for complete search history.

(56) References Cited

U.S. PATENT DOCUMENTS

| 7,576,471 B1 | 8/2009 | Solal | |
| 2009/0267707 A1* | 10/2009 | Miura | H03H 9/1457 |
| | | | 333/193 |

(Continued)

FOREIGN PATENT DOCUMENTS

| JP | 2009-232242 A | 10/2009 |
| JP | 2013-518455 A | 5/2013 |
| WO | 2014/192756 A1 | 12/2014 |

OTHER PUBLICATIONS

Official Communication issued in International Patent Application No. PCT/JP2016/061245, dated Jun. 21, 2016.

*Primary Examiner* — Bryan P Gordon
(74) *Attorney, Agent, or Firm* — Keating & Bennett, LLP

(57) ABSTRACT

An elastic wave device includes an IDT electrode disposed on a piezoelectric substrate and including first and second electrode fingers that are interdigitated. A region where the first and second electrode fingers overlap each other as seen in a direction of propagation of elastic waves is an excitation region. Edge portions where an acoustic velocity is lower than an acoustic velocity in a central portion are disposed on opposite sides of a central portion in the excitation region. A first busbar and second busbar include inner busbar portions, central busbar portions, and outer busbar portions. First and second offset electrode fingers extend from the inner busbar portions toward the leading ends of the second electrode fingers or first electrode fingers.

20 Claims, 3 Drawing Sheets

(51) Int. Cl.
*H03H 9/25* (2006.01)
*H03H 9/56* (2006.01)
*H03H 9/64* (2006.01)

(56) References Cited

U.S. PATENT DOCUMENTS

| | | | |
|---|---|---|---|
| 2011/0068655 A1* | 3/2011 | Solal | H03H 9/02858 310/313 B |
| 2013/0051588 A1* | 2/2013 | Ruile | H03H 3/08 381/190 |
| 2016/0072475 A1* | 3/2016 | Mimura | H03H 9/25 333/195 |

* cited by examiner

ELASTIC WAVE DEVICE

CROSS REFERENCE TO RELATED APPLICATIONS

This application claims the benefit of priority to Japanese Patent Application No. 2015-089209 filed on Apr. 24, 2015 and is a Continuation Application of PCT Application No. PCT/JP2016/061245 filed on Apr. 6, 2016. The entire contents of each application are hereby incorporated herein by reference.

BACKGROUND OF THE INVENTION

1. Field of the Invention

The present invention relates to elastic wave devices using a piston mode.

2. Description of the Related Art

An elastic wave device that uses a piston mode is disclosed in International Publication No. WO 2014-192756 A1. The elastic wave device described in International Publication No. WO 2014-192756 A1 includes wide portions on opposite sides of an excitation region in an overlap width direction such that an acoustic velocity in the wide portions is lower than that in a central area in the excitation region in the overlap width direction. A busbar has a plurality of apertures spaced away from each other along a direction of propagation of elastic waves. The busbar includes an inner busbar portion located inward from the apertures in the overlap width direction, a central busbar portion where the apertures are disposed, and an outer busbar portion located outward from the central busbar portion in the overlap width direction. The inner busbar portion has a strip shape extending in the direction of propagation of elastic waves.

In International Publication No. WO 2014-192756 A1, the wide portions form edge portions where an acoustic velocity is low, and the strip inner busbar portion is included. This aims at suppressing transverse modes.

Unfortunately, the elastic wave device described in International Publication No. WO 2014-192756 A1 may undergo undesired ripples in a resonance characteristic or filter characteristic.

SUMMARY OF THE INVENTION

Preferred embodiments of the present invention provide elastic wave devices that significantly reduce or prevent ripples.

An elastic wave device according to a preferred embodiment of the present invention includes a piezoelectric substrate and an interdigital transducer (IDT) electrode disposed on the piezoelectric substrate. The IDT electrode includes a first busbar, a second busbar arranged separately from the first busbar, a plurality of first electrode fingers including base ends connected to the first busbar and extending toward the second busbar, and a plurality of second electrode fingers including base ends connected to the second busbar and extending toward the first busbar. When a direction in which the first and second electrode fingers extend is an overlap width direction and a direction perpendicular or substantially perpendicular to the overlap width direction is a width direction, edge portions where an acoustic velocity is lower than an acoustic velocity in a central portion in an excitation region in the overlap width direction are disposed on opposite sides of the excitation region in the overlap width direction. At least one of the first and second busbars includes a plurality of apertures spaced away from each other along the width direction. At least one of the first and second busbars includes an inner busbar portion located inward from the apertures in the overlap width direction, a central busbar portion where the apertures are disposed, and an outer busbar portion located on a side opposite to the inner busbar portion such that the central busbar portion is disposed therebetween. At least one of the first and second busbars includes offset electrode fingers extending from the inner busbar portion toward leading ends of the second electrode fingers or leading ends of the first electrode fingers.

In a specific aspect of an elastic wave device according to a preferred embodiment of the present invention, a dimension of the inner busbar portion along the overlap width direction may be smaller than a dimension of the central busbar portion along the overlap width direction. In that case, although excitation mode confined to the inner busbar portion tends to appear, the present preferred embodiment of the present invention effectively reduces or prevents ripples.

In another specific aspect of an elastic wave device according to a preferred embodiment of the present invention, an acoustic velocity in a region where the offset electrode fingers are disposed may have a magnitude between an acoustic velocity in the inner busbar portion and an acoustic velocity in a region between the offset electrode fingers and the edge portions. In that case, ripples are further effectively reduced or prevented.

In yet another specific aspect of an elastic wave device according to a preferred embodiment of the present invention, the dimension of the inner busbar portion along the overlap width direction may be in a range of about $0.1\lambda$ to about $0.5\lambda$ inclusive, for example. In that case, although the excitation mode confined to the inner busbar portion tends to appear, the present preferred embodiment of the present invention effectively reduces or prevents ripples. In addition, transverse modes are also reduced or prevented more reliably.

In still another specific aspect of an elastic wave device according to a preferred embodiment of the present invention, a dimension of each of the first and second electrode fingers in the edge portions along the width direction may be larger than a dimension of each of the first and second electrode fingers in the central portion in the excitation region along the width direction. In that case, the edge portions are easily provided.

In yet a further specific aspect of an elastic wave device according to a preferred embodiment of the present invention, a dimension of each of the offset electrode fingers along the width direction may be larger than the dimension of each of the first and second electrode fingers in the central portion in the excitation region along the width direction of the first and second electrode fingers. In that case, a reduction in acoustic velocity that is not compensated for by the edge portions is able to be offset.

In still a further specific aspect of an elastic wave device according to a preferred embodiment of the present invention, the edge portions may include a dielectric film laminated on top surfaces or bottom surfaces of the first and second electrode fingers. In that case, the first and second electrode fingers are easily provided.

According to the elastic wave devices of preferred embodiments of the present invention, ripples are effectively reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention is clarified below by describing specific preferred embodiments of the present invention with reference to the drawings.

The preferred embodiments described in the present specification are illustrative, and it is pointed out that configurations can be partially replaced or combined between different preferred embodiments.

Figure 1:
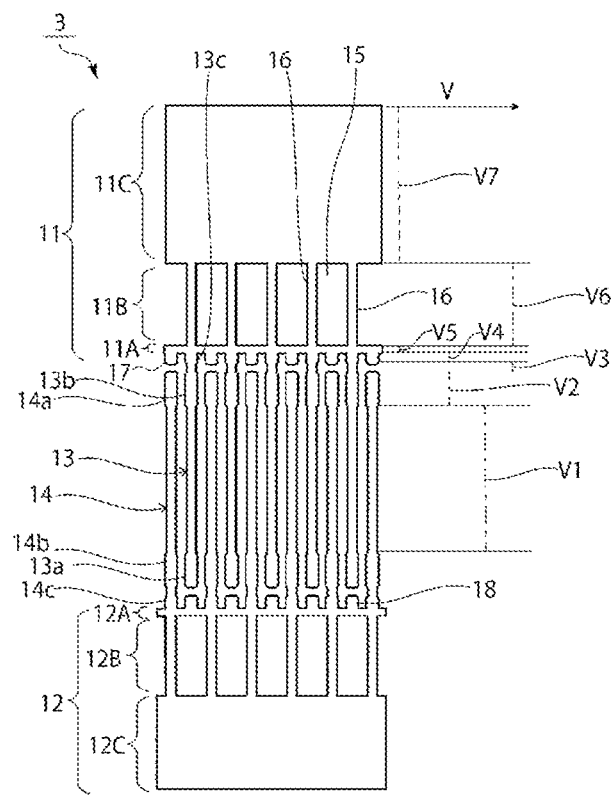
FIG. 1 is a plan view that illustrates a structure of an interdigital transducer (IDT) electrode in an elastic wave device according to a first preferred embodiment of the present invention.
Figure 2:
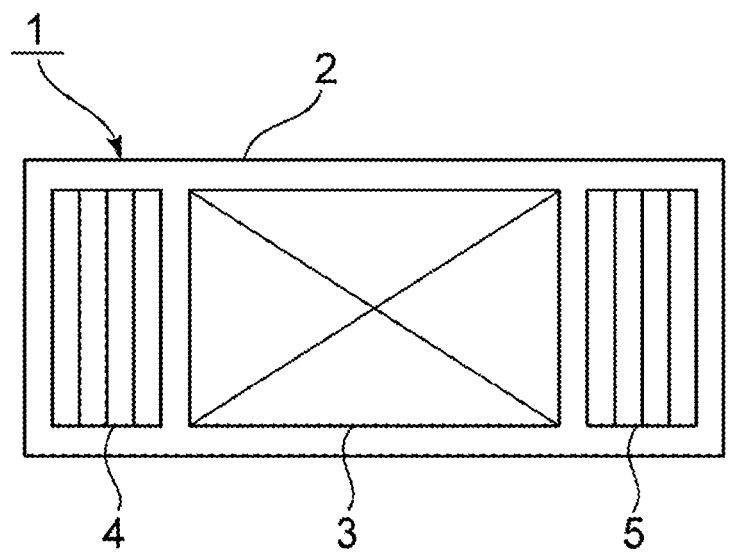
FIG. 2 is a diagrammatic plan view of the elastic wave device according to the first preferred embodiment of the present invention.

FIG. 1 is a plan view that illustrates a structure of an interdigital transducer (IDT) electrode in an elastic wave device according to a first preferred embodiment of the present invention. FIG. 2 is a diagrammatic plan view of the elastic wave device according to the first preferred embodiment of the present invention.

As illustrated in FIG. 2, an elastic wave device 1 includes a piezoelectric substrate 2. The piezoelectric substrate is made of a piezoelectric single crystal or piezoelectric ceramics. An IDT electrode 3 is disposed on the piezoelectric substrate 2. FIG. 2 schematically illustrates a portion only where the IDT electrode 3 is located.

Reflectors 4 and 5 are disposed on opposite sides of the IDT electrode 3 in a direction of propagation of elastic waves. The elastic wave device 1 is a one-port elastic wave resonator including the above-described structure. The elastic wave device according to a preferred embodiment of the present invention is not limited to the elastic wave resonator and may be other elastic wave devices, including an elastic wave filter.

The IDT electrode 3 is described with reference to FIG. 1.

The IDT electrode 3 includes first and second busbars 11 and 12 spaced away from each other. The first busbar 11 and second busbar 12 extend in parallel or substantially in parallel with the direction of propagation of elastic waves.

The first busbar 11 is connected to base ends of a plurality of first electrode fingers 13. The plurality of first electrode fingers 13 extend from the first busbar 11 toward the second busbar 12. That is, the plurality of first electrode fingers 13 extend in a direction perpendicular or substantially perpendicular to the direction of propagation of elastic waves.

The second busbar 12 are connected to base ends of a plurality of second electrode fingers 14. The plurality of second electrode fingers 14 extend from the second busbar 12 toward the first busbar 11. That is, the plurality of second electrode fingers 14 also extend in the direction perpendicular or substantially perpendicular to the direction of propagation of elastic waves.

The plurality of first electrode fingers 13 and plurality of second electrode fingers 14 are interdigitated. Accordingly, the region where the plurality of first electrode fingers 13 and plurality of second electrode fingers 14 overlap each other as seen from the direction of propagation of elastic waves defines an excitation region. The dimension in the direction in which the first and second electrode fingers 13 and 14 extend in the excitation region is an overlap width. Accordingly, in the following description, the direction in which the first and second electrode fingers 13 and 14 extend is referred to as an overlap width direction.

The above-described direction of propagation of elastic waves is referred to as a width direction of the first and second electrode fingers 13 and 14.

Each of the first electrode fingers 13 includes a wide portion 13a at its leading end. The dimension of the wide portion 13a along the above-described width direction is larger than the dimension of the first electrode finger 13 along the above-described width direction in the central portion in the excitation region. In the present specification, the wide portion in an electrode finger indicates a portion whose dimension along the above-described width direction is larger than that of the electrode finger portion other than the wide portion. Each of the second electrode fingers 14 also includes a wide portion 14a at its leading end.

The region where the wide portion 13a is disposed and the region where the wide portion 14a is disposed are edge portions. In the IDT electrode 3, the above-described edge portions are disposed on the opposite sides of the central portion in the excitation region. Each of the edge portions may include a plurality of wide portions.

The second electrode finger 14 includes a wide portion 14b in a region that overlaps the wide portion 13a in the direction of propagation of elastic waves. Similarly, the first electrode finger 13 includes a wide portion 13b in a region that overlaps the wide portion 14a in the direction of propagation of elastic waves. Hence, the acoustic velocity in the above-described edge portions is also lowered by the inclusion of the wide portions 13b and 14b. The wide portions 13b and 14b are optional.

The first electrode finger 13 and second electrode finger 14 further include wide portions 13c and 14c at their respective base end side portions. The wide portions 13c and 14c are disposed in locations that overlap first and second offset electrode fingers 17 and 18 described below, respectively, in the direction of propagation of elastic waves.

In FIG. 1, propagation velocities of elastic waves (hereinafter, acoustic velocities) in regions are schematically illustrated on the right side of the IDT electrode 3.

An acoustic velocity V2 in the above-described edge portion is lower than an acoustic velocity V1 in the central portion in the excitation region. This is because of the wide portions 13a and 14a. Thus, the piston mode is able to be generated and used.

The first busbar 11 includes an inner busbar portion 11A, a central busbar portion 11B, and an outer busbar portion 11C. Here, the side on which the first and second electrode fingers 13 and 14 extend in the above-described overlap width direction is defined as inner, and its opposite side is defined as outer.

The inner busbar portion 11A is a portion connected to the base ends of the plurality of first electrode fingers 13. The inner busbar portion 11A has an elongated strip shape extending in the direction of propagation of elastic waves. Because that portion is metalized, an acoustic velocity V5 in the inner busbar portion 11A is lower than the acoustic velocities V1 and V2.

The central busbar portion 11B includes a plurality of apertures 15 distributed along the direction of propagation of elastic waves. The apertures 15 are positioned between neighboring coupling portions 16 extending in the direction in which the electrode fingers extend. Each of the coupling portions 16 is not particularly limited and has the same width as that of the first electrode finger 13. The coupling portion 16 lies on an extension line of the first electrode finger 13. The dimension and location of the coupling portion 16 are not limited to the above-described example. Preferably, the coupling portion 16 may have the same width of that of the first electrode finger 13 and may lie on the extension line of the first electrode finger 13. This facilitates manufacture.

The aperture 15 preferably has a rectangular or substantially rectangular shape in two dimensions, and it may also other shapes in two dimensions.

In the central busbar portion 11B, the coupling portions 16 and apertures 15 are arranged in an alternating manner along the direction of propagation of elastic waves. Accordingly, large areas are not metalized, and an acoustic velocity V6 in the central busbar portion 11B is higher than the acoustic velocity V5 in the inner busbar portion 11A and acoustic velocity V1 in the central portion in the excitation region.

The outer busbar portion 11C has no apertures. Accordingly, the outer busbar portion 11C is a metalized region, and an acoustic velocity V7 in the outer busbar portion 11C is low, like the acoustic velocity V5 in the inner busbar portion 11A.

Similarly, the second busbar 12 includes an inner busbar portion 12A, a central busbar portion 12B, and an outer busbar portion 12C. The first and second busbars 11 and 12 are configured in substantially the same manner as the first and second busbars in the elastic wave device described in International Publication No. WO 2014-192756 A1. Accordingly, the piston mode is able to be generated and used, and ripples in transverse modes are able to be reduced or prevented.

The present inventors discovered that undesired ripples occurred in such a structure including the first and second busbars 11 and 12, as previously described. From a study of a cause of the ripples, it has been discovered that spurious mode occurred in the portions where the above-described inner busbar portions 11A and 12A are disposed and their vicinities and this caused the above-described ripples.

One of the unique features of the elastic wave device 1 is that it includes the first offset electrode fingers 17 extending from the inner busbar portion 11A toward the second electrode fingers 14 and the second offset electrode fingers 18 extending from the inner busbar portion 12A in the second busbar 12 toward the first electrode fingers 13. The leading end of each of the first offset electrode fingers 17 is spaced apart from the leading end of the second electrode finger 14 in the overlap width direction such that a gap is present therebetween. The leading end of each of the second offset electrode fingers 18 is spaced apart from the leading end of the first electrode finger 13 in the overlap width direction such that a gap is present therebetween.

In the region where the first offset electrode fingers 17 are disposed, the wide portions 13c are disposed at the base ends of the first electrode fingers 13. Accordingly, an acoustic velocity V4 in the region where the first offset electrode fingers 17 are disposed is equivalent or substantially equivalent to the acoustic velocity V2 in the edge portion. Hence, the acoustic velocity V4 in the region where the first offset electrode fingers are disposed is an acoustic velocity between the acoustic velocity V5 in the inner busbar portion 11A and an acoustic velocity V3 in the gap region between the leading ends of the first offset electrode fingers 17 and the leading ends of the second electrode fingers 14. Accordingly, the difference between the acoustic velocity in the inner busbar portion 11A and that in its adjacent inner region in the overlap width direction is mitigated by the inclusion of the first offset electrode fingers 17.

Similarly, because the second offset electrode fingers 18 are disposed on the side of the inner busbar portion 12A in the second busbar 12 and the second electrode fingers 14 include the wide portions 14c at their base ends, the acoustic velocity in the region where the second offset electrode fingers 18 are disposed is the same or substantially the same as the acoustic velocity V5 in the region where the first offset electrode fingers 17 are disposed.

The elastic wave device 1 in the present preferred embodiment includes the first and second offset electrode fingers 17 and 18 and wide portions 13c and 14c are disposed in the structure in which the first and second busbars 11 and 12 have the strip inner busbar portions 11A and 12A, as described above. This structure mitigates the difference between the acoustic velocity in the inner busbar portions 11A and 12A and that in their immediately inner regions in the overlap width direction, as described above, and thus the occurrence of undesired spurious mode is reduced or prevented. This is described below based on a concrete experiment example.

Figure 3:
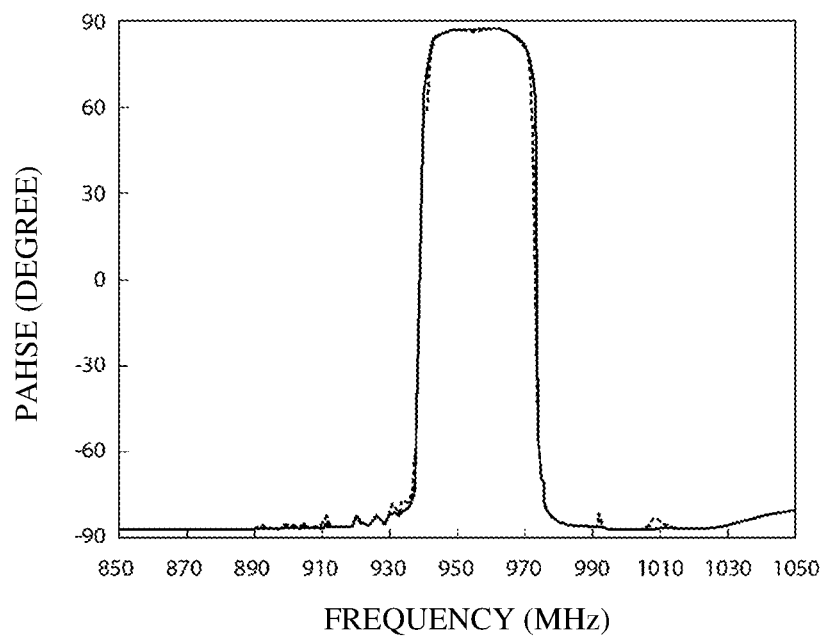
FIG. 3 illustrates a phase characteristic of the elastic wave device according to the first preferred embodiment of the present invention.
Figure 4:
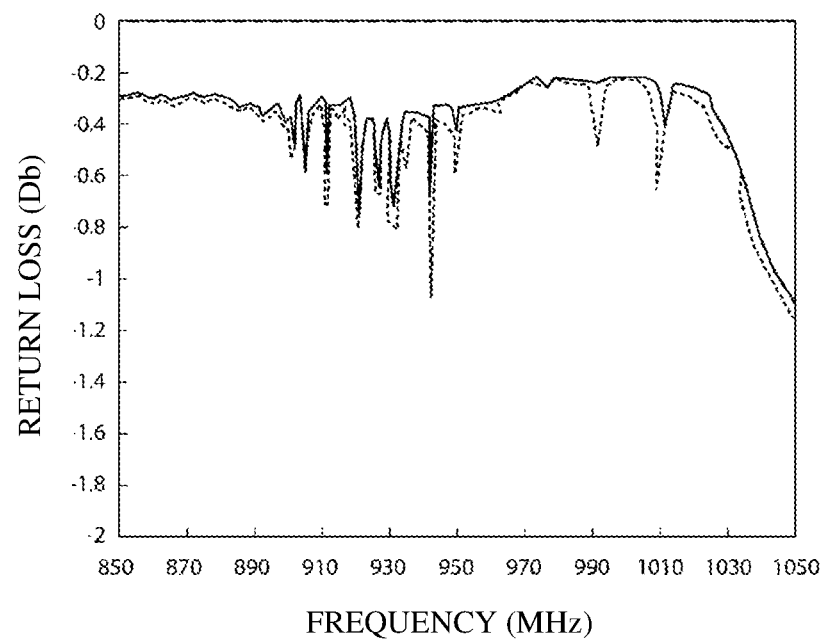
FIG. 4 illustrates a return loss characteristic of the elastic wave device according to the first preferred embodiment of the present invention.

FIG. 3 illustrates a phase characteristic of the elastic wave device 1 according to the first preferred embodiment of the present invention. FIG. 4 illustrates a return loss characteristic thereof. The specifications of the elastic wave device 1 are described below.

Design resonant frequency=936 MHz

The piezoelectric substrate 2 was made of lithium niobate ($LiNbO_3$). The IDT electrode 3 and reflectors 4 and 5 were defined by a multilayer metal film described below, and disposed on the piezoelectric substrate 2.

The composition of the multilayer metal film: multilayer film in which nickel-chromium (NiCr), platinum (Pt), titanium (Ti), aluminum (Al), and titanium (Ti) layers are laminated in this order from the piezoelectric substrate 2 side.

The number of pairs of electrode fingers for the first and second electrode fingers 13 and 14 was 100. The wavelength defined by the pitch of the electrode fingers in the IDT electrode 3 is λ.

The dimension of the central portion in the excitation region along the overlap width direction was about 15λ. The dimension of the edge portion along the overlap width direction was about 0.8λ. The dimension of the first and second electrode fingers 13 and 14 in the central portion in the excitation region in the width direction was about (¼) λ, and its duty was about 0.5. The width of each of the wide portions 13a, 13b, 14a, and 14b was about (⅞) λ (¼) λ, and its duty was about 0.7. The width of each of the wide portions 13c and 14c was about (⅞) λ (¼) λ, and its duty was about 0.7.

The dimension of each of the first and second offset electrode fingers 17 and 18 along the overlap width direction, that is, the offset length was about 0.1λ, its width was about (⅞) λ (¼) λ, and its duty was about 0.7.

The dimension of each of the inner busbar portions 11A and 12A along the overlap width direction, that is, the width was about 0.225λ. The dimension of each of the central busbar portions 11B and 12B along the overlap width direction was about 2λ. The width of each of the coupling portions 16 was about (⅛) λ, and its duty was about 0.25. The width of each of the apertures 15 was about (7.5/5) λ (¼) λ, and its duty was about 0.75.

The dimension of the outer busbar portion 11C along the overlap width direction was about 20 μm.

The number of electrode fingers in each of the reflectors 4 and 5 was 21.

For comparison, an elastic wave device was produced as a comparative example in the same way as in the above-described preferred embodiment, except that the first and second offset electrode fingers 17 and 18 were not included and the wide portions 13c and 14c were not included. In FIGS. 3 and 4, the solid lines indicate a result for the above-described preferred embodiment, and the broken lines indicate a result for the comparative example.

FIGS. 3 and 4 reveal that in the comparative example many undesired ripples occur in not only the region between the resonant frequency and anti-resonant frequency but also the region lower than the resonant frequency and the region higher than the anti-resonant frequency. In contrast, it is revealed that in the above-described preferred embodiment of the present invention, the ripples are significantly reduced or prevented.

As previously described, in the elastic wave device 1, because the first and second offset electrode fingers 17 and 18 are disposed inward from the inner busbar portions 11A and 12A in the overlap width direction, the difference between the acoustic velocity in the inner busbar portion 11A and that in the region of the leading ends of the second electrode fingers 14 is mitigated. Thus, it is revealed that the above-described undesired ripples based on spurious mode are effectively reduced or prevented.

The wide portions 13b and 13c and wide portions 14b and 14c in the above-described preferred embodiment are optional.

The inner busbar portions 11A and 12A preferably have an elongated strip shape. The dimension of each of the inner busbar portions 11A and 12A along the overlap width direction may preferably be smaller than the dimension of each of the central portions 11B and 12B along the overlap width direction. In that case, although the above-described undesired spurious mode tends to be excited, preferred embodiments of the present invention effectively reduce or prevent ripples resulting from such spurious mode. The width being the dimension of each of the inner busbar portions 11A and 12A along the overlap width direction may preferably be equal to or smaller than about 1.0λ, and more preferably be in a range of about 0.1λ to about 0.5λ inclusive, for example. When each of the inner busbar portions 11A and 12A has such a width, although the above-described undesired spurious mode tends to be excited, preferred embodiments of the present invention effectively reduce or prevent ripples resulting from such spurious mode. In that case, a dimension of each of the first and second offset electrode fingers 17 and 18 along the overlap width direction may preferably be between about 0.02λ and about 1.5λ inclusive, for example. With that dimension, the above-described ripples are able to be further effectively reduced or prevented.

The dimension of the edge portion along the overlap width direction may preferably be between about 0.2λ and about 2λ inclusive, for example. With that dimension, the piston mode is provided more reliably.

The wavelength λ is defined by the electrode finger pitch of the first and second electrode fingers 13 and 14. In terms of usage, its suitable range may be between about 1.8 μm and about 5.6 μm inclusive, for example. With that wavelength, the elastic wave device 1 effective for uses for the range of about 700 MHz band to about 2 GHz band can be provided.

The dimension of each of the first and second offset electrode fingers 17 and 18 in the width direction may be equivalent or substantially equivalent to the dimension of each of the wide portions 13a and 14a in the width direction or may be smaller than the dimension of each of the wide portions 13a and 14a in the width direction. Preferably, it may be equivalent or substantially equivalent.

In the above-described preferred embodiment, the edge portions are provided by the formation of the above-described wide portions 13a and 13b and wide portions 14a and 14b. The edge portions may be provided by dielectric films 22 and 23 laminated on the leading end portions in the first and second electrode fingers 13 and 14, as in a second preferred embodiment illustrated in FIG. 5. That is, the acoustic velocity in the edge portions is able to be relatively lowered by lamination of a dielectric film, such as a silicon dioxide (SiO$_2$) film. Thus, the edge portions to provide the piston mode at which the IDT electrode is located in a preferred embodiment of the present invention is not limited to the example including the wide portions. Various methods, including a method and structure in which a dielectric film is laminated, may be used, for example. The edge portions are not particularly limited.

Figure 5:
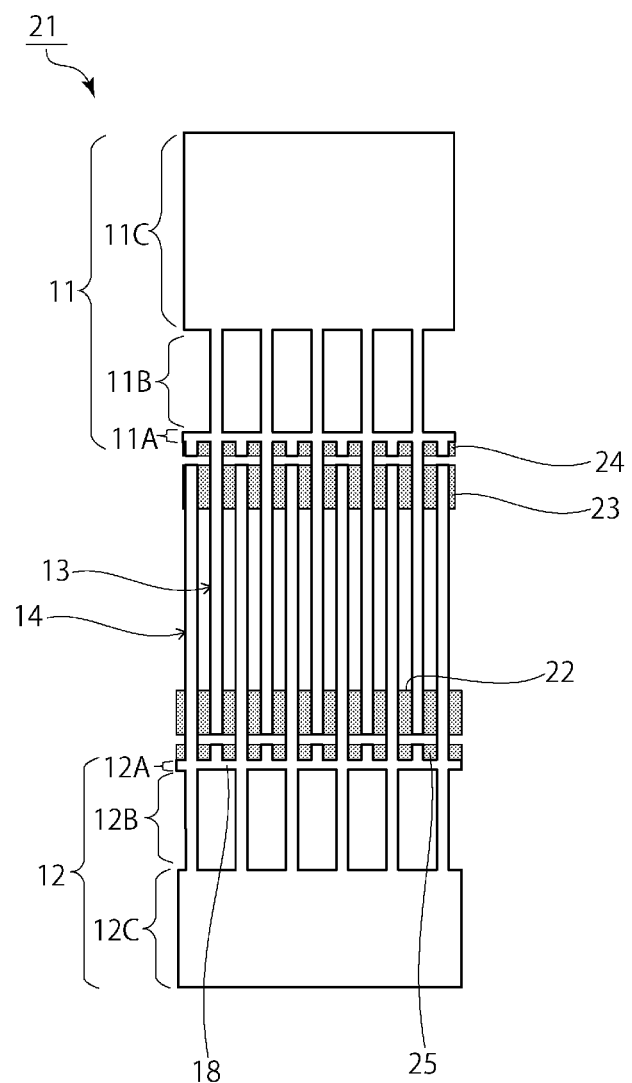
FIG. 5 is a schematic plan view that illustrates an electrode structure in an elastic wave device according to a second preferred embodiment of the present invention.

In an elastic wave device 21 illustrated in FIG. 5, dielectric films 24 and 25 are also laminated in the regions where the first and second offset electrode fingers 17 and 18 are disposed to reduce the acoustic velocity. In the regions where the first and second offset electrode fingers 17 and 18 are disposed, the dielectric films 24 and 25 may be omitted.

The dielectric films may be disposed on the top surfaces of the first and second electrode fingers 13 and 14, and may be disposed on the bottom surfaces thereof.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric substrate; and
   an interdigital transducer (IDT) electrode disposed on the piezoelectric substrate; wherein
   the IDT electrode includes:
   a first busbar;
   a second busbar separate from the first busbar;
   a plurality of first electrode fingers including base ends connected to the first busbar and extending toward the second busbar; and
   a plurality of second electrode fingers including base ends connected to the second busbar and extending toward the first busbar;
   when a direction in which the first and second electrode fingers extend is an overlap width direction and a direction perpendicular or substantially perpendicular to the overlap width direction is a width direction, edge portions where an acoustic velocity is lower than an acoustic velocity in a central portion in an excitation region in the overlap width direction are disposed on opposite sides of the excitation region in the overlap width direction;

at least one of the first and second busbars includes a plurality of apertures spaced away from each other along the width direction;

at least one of the first and second busbars includes an inner busbar portion located inward from the apertures in the overlap width direction, a central busbar portion where the apertures are disposed, and an outer busbar portion located on a side opposite to the inner busbar portion such that the central busbar portion is disposed therebetween; and at least one of the first and second busbars includes offset electrode fingers extending from the inner busbar portion toward leading ends of the second electrode fingers or leading ends of the first electrode fingers.

2. The elastic wave device according to claim 1, wherein a dimension of the inner busbar portion along the overlap width direction is smaller than a dimension of the central busbar portion along the overlap width direction.

3. The elastic wave device according to claim 1, wherein an acoustic velocity in a region where the offset electrode fingers are disposed has a magnitude between an acoustic velocity in the inner busbar portion and an acoustic velocity in a region between the offset electrode fingers and the edge portions.

4. The elastic wave device according to claim 1, wherein a dimension of the inner busbar portion along the overlap width direction is in a range of about $0.1\lambda$ to about $0.5\lambda$ inclusive.

5. The elastic wave device according to claim 1, wherein a dimension of each of the first and second electrode fingers in the edge portions along the width direction is larger than a dimension of each of the first and second electrode fingers in the central portion in the excitation region along the width direction.

6. The elastic wave device according to claim 5, wherein a dimension of each of the offset electrode fingers along the width direction is larger than the dimension of each of the first and second electrode fingers in the central portion in the excitation region along the width direction of the first and second electrode fingers.

7. The elastic wave device according to claim 1, wherein the edge portions include a dielectric film laminated on top surfaces or bottom surfaces of the first and second electrode fingers.

8. The elastic wave device according to claim 1, wherein each of the first electrode fingers and the second electrode fingers include a wide portion at a leading end thereof the defines the edge portions.

9. The elastic wave device according to claim 1, wherein each of the first electrode fingers and the second electrode fingers include wide portions at a base end side portion thereof.

10. The elastic wave device according to claim 1, wherein the inner busbar portion has an elongated strip shape extending in a direction of propagation of elastic waves.

11. The elastic wave device according to claim 1, wherein the apertures are rectangular or substantially rectangular.

12. The elastic wave device according to claim 1, further comprising coupling portions arranged to alternate with the apertures in a direction of propagation of elastic waves.

13. The elastic wave device according to claim 1, wherein the outer busbar portion includes no apertures.

14. The elastic wave device according to claim 1, wherein the first and second busbars are structured to generate a piston mode.

15. The elastic wave device according to claim 1, wherein a dimension of each of the offset fingers of the first and second busbars has a dimension between about $0.02\lambda$ and about $1.5\lambda$ inclusive.

16. The elastic wave device according to claim 1, wherein a dimension of each of the edge portions is about $0.2\lambda$ and about $2.0\lambda$ inclusive.

17. The elastic wave device according to claim 1, wherein a pitch of the first and second electrode fingers is 1.8 μm and about 5.6 μm inclusive.

18. The elastic wave device according to claim 8, wherein a dimension of each of the offset electrode fingers in the width direction is equal or substantially equal to a dimension of the wide portions.

19. The elastic wave device according to claim 9, wherein a dimension of each of the offset electrode fingers in the width direction is equal or substantially equal to a dimension of the wide portions.

20. The elastic wave device according to claim 1, further comprising dielectric films in regions where the offset electrode fingers are located.

\* \* \* \* \*